United States Patent
Carey et al.

(10) Patent No.: US 7,289,304 B2
(45) Date of Patent: Oct. 30, 2007

(54) CURRENT-PERPENDICULAR-TO-THE-PLANE (CPP) MAGNETORESISTIVE SENSOR WITH IMPROVED ANTIPARALLEL-PINNED STRUCTURE

(75) Inventors: Matthew J. Carey, San Jose, CA (US); Jeffrey R. Childress, San Jose, CA (US); Stefan Maat, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 396 days.

(21) Appl. No.: 10/977,300

(22) Filed: Oct. 29, 2004

(65) Prior Publication Data

US 2006/0092580 A1 May 4, 2006

(51) Int. Cl.
*G11B 5/33* (2006.01)
*G11B 5/127* (2006.01)

(52) U.S. Cl. .............. 360/324.11; 360/313; 360/324.1
(58) Field of Classification Search .............. 360/324, 360/324.1, 324.11, 324.12
See application file for complete search history.

(56) References Cited

U.S. PATENT DOCUMENTS

| | | | | |
|---|---|---|---|---|
| 5,408,377 | A * | 4/1995 | Gurney et al. | 360/325 |
| 5,465,185 | A * | 11/1995 | Heim et al. | 360/324.11 |
| 5,583,725 | A * | 12/1996 | Coffey et al. | 360/324.11 |
| 5,701,223 | A * | 12/1997 | Fontana et al. | 360/324.11 |
| 5,880,913 | A * | 3/1999 | Gill | 360/324.11 |
| 5,920,446 | A * | 7/1999 | Gill | 360/324 |
| 6,303,218 | B1 * | 10/2001 | Kamiguchi et al. | 428/332 |
| 6,741,432 | B2 | 5/2004 | Pinarbasi | |
| 6,751,072 | B2 | 6/2004 | Freitag et al. | |
| 2001/0001256 | A1 * | 5/2001 | Hsiao | 360/246.6 |
| 2002/0101691 | A1 * | 8/2002 | Zhu | 360/324 |
| 2002/0159201 | A1 * | 10/2002 | Li et al. | 360/324.1 |
| 2002/0177013 | A1 * | 11/2002 | Hiramoto et al. | 428/702 |
| 2003/0011948 | A1 * | 1/2003 | Saito et al. | 360/324.11 |
| 2003/0179514 | A1 * | 9/2003 | Pinarbasi | 360/324.11 |
| 2003/0179515 | A1 * | 9/2003 | Pinarbasi | 360/324.11 |
| 2004/0075957 | A1 * | 4/2004 | Li et al. | 360/324.11 |
| 2004/0246776 | A1 * | 12/2004 | Covington | 365/173 |
| 2005/0007707 | A1 * | 1/2005 | Gill | 360/324.11 |

OTHER PUBLICATIONS

N. Wiese et al., "Antiferromagnetically coupled CoFeB/Ru/CoFeB trilayers", Appl. Phys. Lett., vol. 85, No. 11, Sep. 13, 2004, pp. 2020-2022.

(Continued)

*Primary Examiner*—Andrea Wellington
*Assistant Examiner*—Jason M. Garr
(74) *Attorney, Agent, or Firm*—Thomas R. Berthold

(57) ABSTRACT

A current-perpendicular-to-the-plane spin-valve (CPP-SV) magnetoresistive sensor has an improved antiparallel (AP) pinned structure. The AP-pinned structure has two ferromagnetic layers separated by a nonmagnetic antiparallel coupling (APC) layer and with their magnetization directions oriented antiparallel. One of the ferromagnetic layers in the AP-pinned structure is the reference layer in contact with the CPP-SV sensor's nonmagnetic electrically conducting spacer layer. In the improved AP-pinned structure each of the ferromagnetic layers has a thickness greater than 30 Å, preferably greater than approximately 50 Å, and the APC layer is either Ru or Ir with a thickness less than 7 Å, preferably about 5 Å or less. The ultrathin APC layer, especially if formed of iridium (Ir), provides significant coupling strength to allow the thick ferromagnetic layers to retain their magnetization directions in a stable antiparallel orientation.

2 Claims, 3 Drawing Sheets

OTHER PUBLICATIONS

A. Tanaka et al., "Spin-valve heads in the current-perpendicular-to-plane mode for ultrahigh-density recording", IEEE Transactions on Magnetics, 38 (1): 84-88 Part 1 Jan. 2002.

S. Dubois et al., "Evidence for a short spin diffusion length in permalloy from the giant magnetoresistance of multilayered nanowires", Phys. Rev. B 60, pp. 477-484 (1999).

* cited by examiner

CURRENT-PERPENDICULAR-TO-THE-PLANE (CPP) MAGNETORESISTIVE SENSOR WITH IMPROVED ANTIPARALLEL-PINNED STRUCTURE

BACKGROUND OF THE INVENTION

1. Field of the Invention

The invention relates to a current-perpendicular-to-the-plane (CPP) magnetoresistive sensor that operates with the sense current directed perpendicularly to the planes of the layers making up the sensor stack.

2. Background of the Invention

One type of conventional magnetoresistive sensor used as the read head in magnetic recording disk drives is a "spin-valve" (SV) sensor. A SV magnetoresistive sensor has a stack of layers that includes two ferromagnetic layers separated by a nonmagnetic electrically conductive spacer layer, which is typically copper (Cu). One ferromagnetic layer has its magnetization direction fixed, such as by being pinned by exchange coupling with an adjacent antiferromagnetic layer, and the other ferromagnetic layer has its magnetization direction "free" to rotate in the presence of an external magnetic field. With a sense current applied to the sensor, the rotation of the free-layer magnetization relative to the fixed-layer magnetization is detectable as a change in electrical resistance.

In a magnetic recording disk drive SV read sensor or head, the magnetization of the fixed or pinned layer is generally perpendicular to the plane of the disk, and the magnetization of the free layer is generally parallel to the plane of the disk in the absence of an external magnetic field. When exposed to an external magnetic field from the recorded data on the disk, the free-layer magnetization will rotate, causing a change in electrical resistance. If the sense current flowing through the SV is directed parallel to the planes of the layers in the sensor stack, the sensor is referred to as a current-in-the-plane (CIP) sensor, while if the sense current is directed perpendicular to the planes of the layers in the sensor stack, it is referred to as current-perpendicular-to-the-plane (CPP) sensor. CPP-SV read heads are described by A. Tanaka et al., "Spin-valve heads in the current-perpendicular-to-plane mode for ultrahigh-density recording", *IEEE TRANSACTIONS ON MAGNETICS*, 38 (1): 84-88 Part 1 January 2002.

One type of CPP-SV used in read heads includes an antiparallel (AP) pinned structure. The AP-pinned structure has first (AP1) and second (AP2) ferromagnetic layers separated by a nonmagnetic antiparallel coupling (APC) layer with the magnetization directions of the two AP-pinned ferromagnetic layers oriented substantially antiparallel. AP2, which is in contact with the nonmagnetic APC layer on one side and the Cu spacer on the other side, is typically referred to as the reference layer. AP1, which is typically in contact with an antiferromagnetic or hard magnet pinning layer on one side and the nonmagnetic APC layer on the other side, is typically referred to as the pinned layer. If the AP-pinned structure is the "self-pinned" type, then no antiferromagnetic layer is required. In a self-pinned structure where no antiferromagnet or hard magnet is present, AP1 is in contact with a seed layer on the sensor substrate. The AP-pinned structure minimizes magnetostatic coupling between the reference layer and the CPP-SV free ferromagnetic layer. The AP-pinned structure, also called a "laminated" pinned layer, is described in U.S. Pat. No. 5,465,185.

The magnetoresistance ($\Delta R/R$) of a CPP-SV read head can be increased by increasing the thickness of the reference ferromagnetic (AP2) layer to generate more bulk electron spin scattering within the AP2 layer. The spin-diffusion length for typical CoFe and NiFe alloys is greater than the typical thickness of AP2, which is about 15-30 Å. For example, the spin-diffusion length of permalloy ($Ni_{81}Fe_{19}$) was measured by S. Dubois et al. as 43 Å (*Phys. Rev. B* 60, page 477 (1999)), so increasing AP2 to or beyond the 43 Å for a NiFe AP2 layer is desirable. When the thickness of AP2 is increased, the thickness of AP1 also has to be increased to cancel out the magnetic stray fields originating from the two AP layers acting onto the free layer. The AP1 may even have to be thicker than AP2 to obtain stray field cancellation at the free layer because AP1 is farther from the free layer than AP2. When the thickness of AP2 is increased, the magnetic moment of AP1 also has to be increased by increasing the thickness and/or the saturation magnetization of the AP1 layer. The reason for this is to keep the net magnetic moment of the AP-pinned structure small so that the effective pinning field of the antiferromagnetic or hard magnet pinning layer, which is approximately inversely proportional to the net magnetization of the AP-pinned structure, remains high. However, increasing the magnetic moments of the AP-pinned ferromagnetic layers AP1 and AP2 will decrease the saturation field $H_S$ of the AP-structure, i.e., the magnetic field where the antiparallel coupling of the APC layer is overcome and the magnetizations of the two ferromagnetic AP layers become parallel. A high $H_S$, typically more than 5 kOe, is desirable to obtain a magnetically stable sensor.

What is needed is a CPP-SV sensor with improved magnetoresistance as a result of an AP-pinned structure with thick AP-pinned ferromagnetic layers and strong AP coupling.

SUMMARY OF THE INVENTION

The invention is a CPP-SV magnetoresistive sensor with an improved AP-pinned structure. In the AP-pinned structure each of the ferromagnetic layers AP1 and AP2 has a thickness greater than 30 Å, preferably greater than approximately 50 Å, and the APC layer is either Ru or Ir with a thickness less than 7 Å, preferably about 5 Å or less. The ultrathin APC layer, especially if formed of iridium (Ir), provides significant coupling strength to allow thick ferromagnetic layers to be used for AP1 and AP2 without reducing $H_S$. When the CPP-SV sensor is a magnetic recording disk drive read head, the AP-pinned structure is located between the bottom read head shield and the read head free ferromagnetic layer, with the AP2 layer in contact with the nonmagnetic electrically conducting spacer layer of the read head. The AP2 layer can be a lamination or multilayer of CoFe, NiFe and/or Cu to increase the spin-dependent scattering. NiFe provides strong bulk spin-dependent scattering while CoFe/Cu and NiFe/Cu interfaces provide strong interface spin-dependent scattering.

For a fuller understanding of the nature and advantages of the present invention, reference should be made to the following detailed description taken together with the accompanying figures.

DETAILED DESCRIPTION OF THE INVENTION

Figure 1:
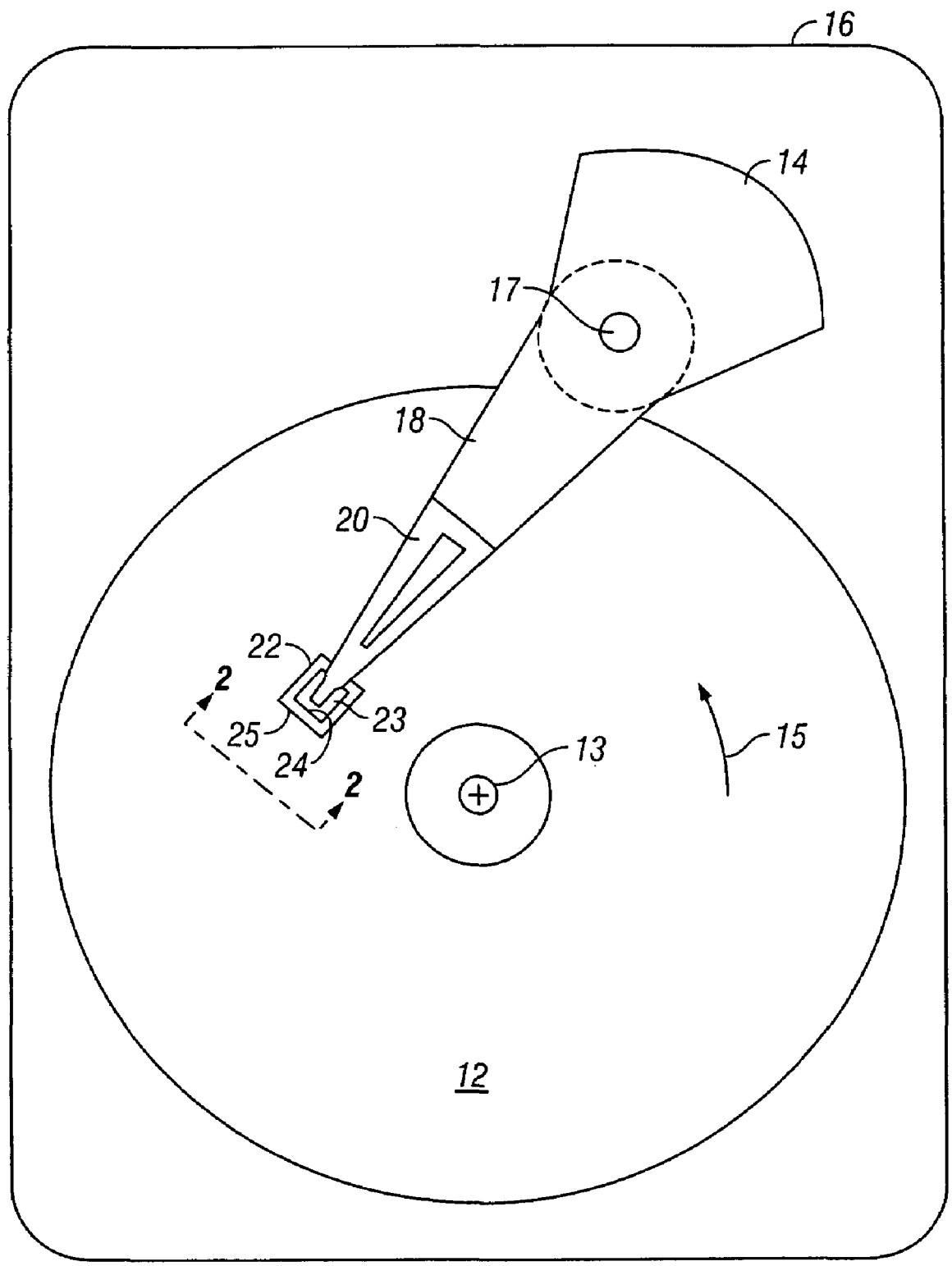
FIG. 1 is a schematic top view of a conventional magnetic recording hard disk drive with the cover removed.

The CPP-SV read head has application for use in a magnetic recording disk drive, the operation of which will be briefly described with reference to FIGS. 1-3. FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
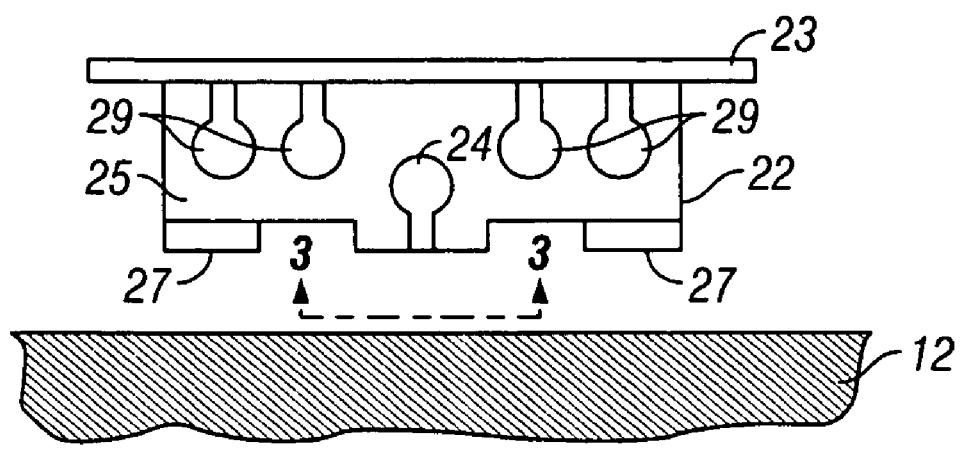
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 22 in very close proximity to or near contact with the surface of disk 12. The read/write head 24 is formed on the trailing surface 25 and is connected to the disk drive read/write electronics by electrical connection to terminal pads 29 on the trailing surface 25.

Figure 3:
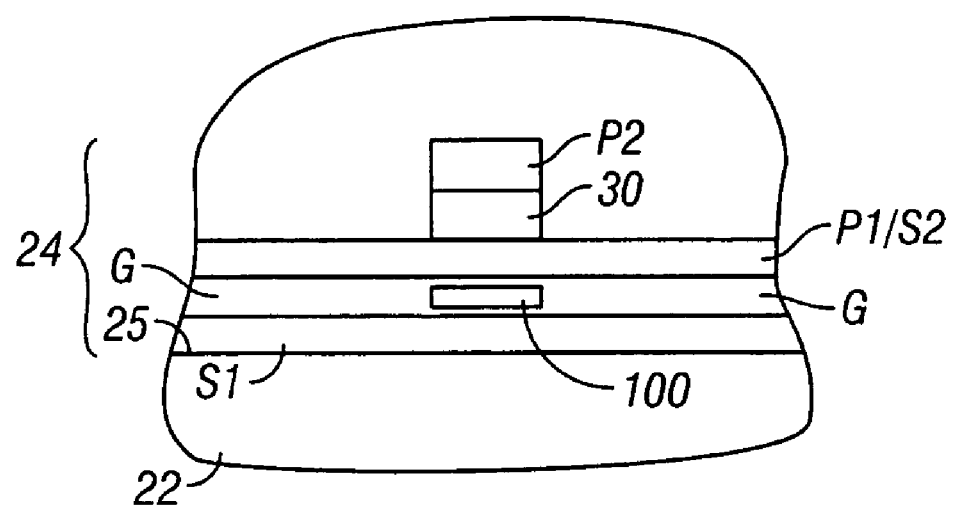
FIG. 3 is a view in the direction 3-3 of FIG. 2 and shows the ends of the read/write head as viewed from the disk.

FIG. 3 is a view in the direction 3-3 of FIG. 2 and shows the ends of read/write head 24 as viewed from the disk 12. The read/write head 24 is a series of thin films deposited and lithographically patterned on the trailing surface 25 of slider 22. The write head includes magnetic write poles P1/S2 and P2 separated by a write gap 30. The CPP-SV magnetoresistive sensor or read head 100 is located between two magnetic shields S1 and P1/S2, with P1/S2 also serving as the first write pole for the write head. The shields S1, S2 are formed of magnetically permeable material and are electrically conductive so they can function as the electrical leads to the read head 100. Separate electrical leads may also be used, in which case the read head 100 is formed in contact with layers of electrically conducting lead material, such as tantalum, gold, or copper, that are in contact with the shields S1, S2.

Figure 4:
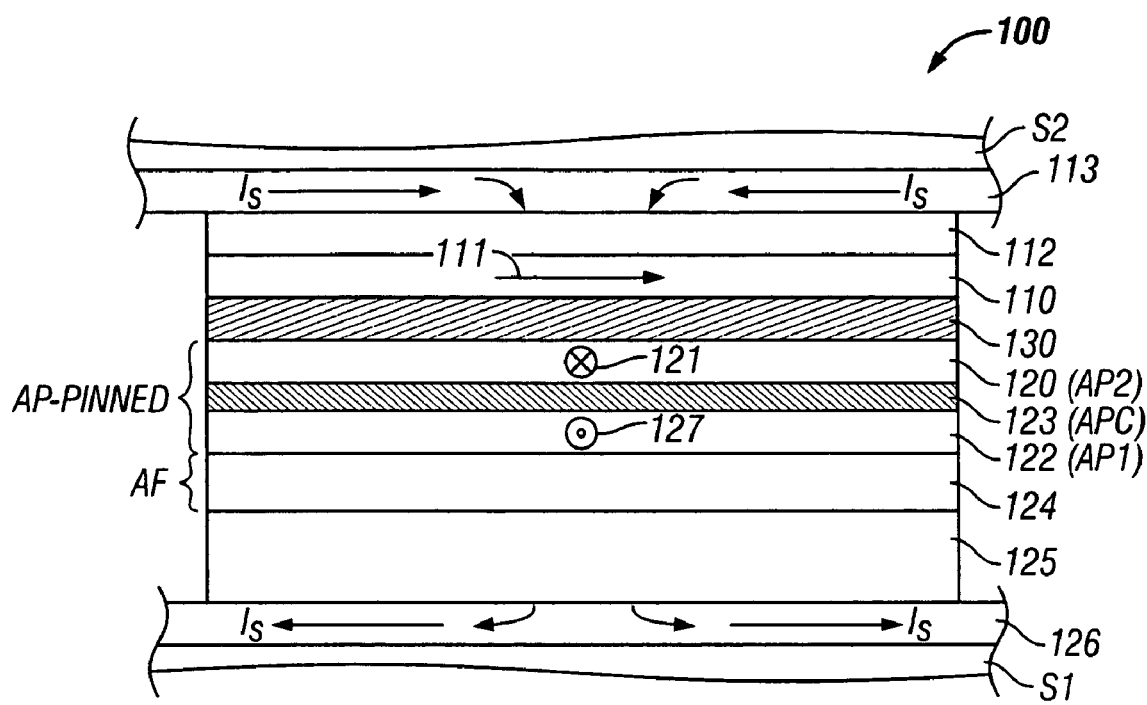
FIG. 4 is a cross-sectional schematic view of a CPP-SV read head showing the stack of layers located between the magnetic shield layers.

FIG. 4 is an enlarged sectional view showing the layers making up sensor 100. Sensor 100 is a CPP-SV read head comprising a stack of layers formed between the two magnetic shield layers S1, S2 that are typically electroplated NiFe alloy films. The lower shield S1 is typically polished by chemical-mechanical polishing (CMP) to provide a smooth substrate for the growth of the sensor stack. The sensor layers include a reference ferromagnetic layer 120 having a fixed magnetic moment or magnetization direction 121 oriented transversely (into the page), a free ferromagnetic layer 110 having a magnetic moment or magnetization direction 111 that can rotate in the plane of layer 110 in response to transverse external magnetic fields from the disk 12, and an electrically conducting spacer layer 130, typically copper (Cu), between the reference layer 120 and free layer 110.

The reference layer 120 is part of the well-known anti-parallel (AP) pinned structure, also called a "laminated" pinned layer, as described in U.S. Pat. No. 5,465,185. The AP-pinned structure minimizes magnetostatic coupling of the reference layer 120 with the free layer 110. The AP-pinned structure comprises the reference ferromagnetic (AP2) layer 120 and a lower ferromagnetic (AP1) layer 122 that are antiferromagnetically coupled across an AP coupling (APC) layer 123, such as Ru or Ir. The AP1 and AP2 ferromagnetic layers have their respective magnetization directions 127, 121 oriented antiparallel. The AP-pinned structure may be "self-pinned" or the AP1 layer 122 may have its magnetization direction pinned by being exchange-coupled to an antiferromagnetic (AF) layer 124 or a hard magnetic layer.

Located between the lower shield layer S1 and the AP-pinned structure are the bottom electrical lead 126 and a seed layer 125. The seed layer 125 may be a single layer or multiple layers of different materials. Located between the free ferromagnetic layer 110 and the upper shield layer S2 are a capping layer 112 and the top electrical lead 113. The capping layer 112 may be a single layer or multiple layers of different materials, such as a Cu/Ru/Ta trilayer.

In the presence of an external magnetic field in the range of interest, i.e., magnetic fields from recorded data on the disk 12, the magnetization direction 111 of free layer 110 will rotate while the magnetization direction 121 of reference layer 120 will remain fixed and not rotate. Thus when a sense current $I_S$ is applied from top lead 113 perpendicularly through the stack to bottom lead 126, the magnetic fields from the recorded data on the disk will cause rotation of the free-layer magnetization 111 relative to the reference-layer magnetization 121, which is detectable as a change in electrical resistance.

The leads 126, 113 are typically Ta. However, a lower resistance material may also be used. They are optional and used to adjust the shield-to-shield spacing. If the leads 126 and 113 are not present, the bottom and top shields S1 and S2 are used as leads. The seed layer 125 is typically one or more layers of NiFeCr, NiFe, Ta, Cu or Ru. The antiferromagnetic layer 124 is typically a Mn alloy, e.g., PtMn, NiMn, FeMn, IrMn, PdMn, PtPdMn or RhMn. If a hard magnetic layer is used instead of an antiferromagnetic layer it is typically a CoPt or FePt alloy, for example CoPtCr. The capping layer 112 provides corrosion protection and is typically formed of Ru or Ta. The ferromagnetic layers 122 (AP1), 120 (AP2), and 110 (free layer) are typically formed of an alloy of one or more of Co, Fe and Ni, or a bilayer of two alloys, such as a CoFe—NiFe bilayer. For example, reference ferromagnetic layer 120 may be a CoFe alloy, typically 10 to 30 Å thick, and the free ferromagnetic layer 110 may be a bilayer of a CoFe alloy, typically 10-15 Å thick and formed on the spacer layer 130, with a NiFe alloy, typically 10-30 Å thick, formed on the CoFe layer of the bilayer. A hard magnetic layer (not shown), such as a CoPt or CoCrPt layer, may also be included outside the sensor stack near the side edges of the free ferromagnetic layer 110 or in the stack for magnetic stabilization or longitudinal biasing of the free ferromagnetic layer 110.

While the read head 100 shown in FIG. 4 is a "bottom-pinned" read head because the AP-pinned structure is below the free layer 110, the free layer 110 can be located below the AP-pinned structure. In such an arrangement the layers of the AP-pinned structure are reversed, with the AP2 layer 120 on top of and in contact with the spacer layer 130.

In the conventional CPP-SV read head with an AP-pinned structure, the AP1 and AP2 ferromagnetic layers are typically less than about 30 Å thick and the Ru APC layer is greater than about 7 Å thick, typically between 7-10 Å. The films of the AP-pinned structure can be reliably sputter deposited to single Angstrom or less accuracy. The films are typically deposited at a rate of near 1 Å/s by opening a shutter and depositing for a given time at a given rate. For example, the differences in antiferromagnetic exchange coupling energy in CoFeB/Ru/CoFeB trilayers as the Ru APC thickness is moved from moved from 7 to 12 Å thickness in 1 Å steps have been described by N. Wiese et al., *Appl. Phys. Lett.*, Vol. 85, No. 11, 13 Sep. 2004

It is desirable to have a thicker AP2 layer to utilize the full spin-diffusion length of the electrons. This will increase bulk spin-dependent scattering of electrons, which increases the magnetoresistance of the read head. However, it is also necessary that the AP-pinned structure exhibit a high saturation field $H_S$ greater than about 5 kOe to obtain a stable antiparallel configuration for the magnetization directions of AP1 and AP2. However, for thick AP1 and AP2 layers, the coupling strength across the APC layer is insufficient to provide an AP-pinned structure with high enough $H_S$.

Figure 5:
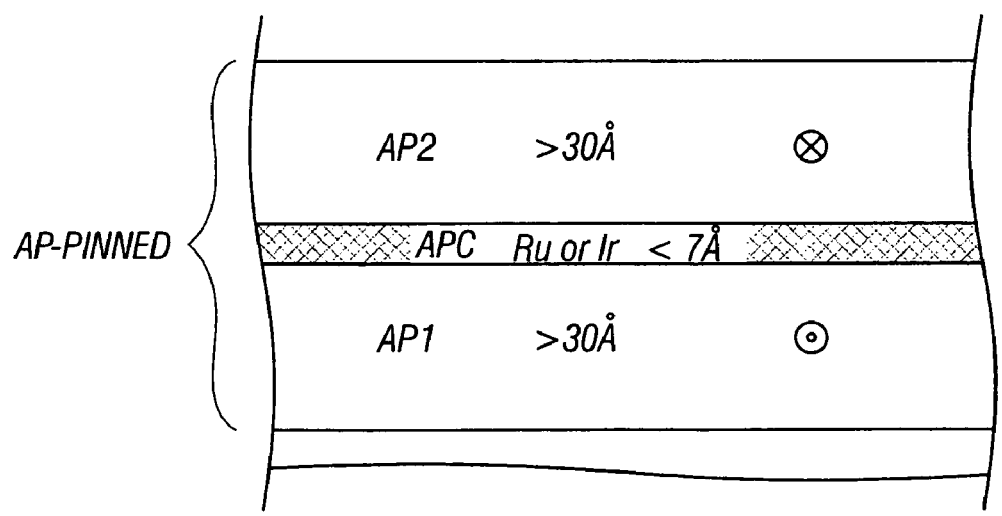
FIG. 5 is a FIG. 4 is a cross-sectional schematic view of the AP-pinned structure of the present invention.

The present invention is the CPP-SV read head as described above with an improved AP-pinned structure, as illustrated in FIG. 5. Each of the ferromagnetic layers AP1 and AP2 has a thickness greater than 30 Å, preferably greater than approximately 50 Å, and the APC layer is either Ru or Ir with a thickness less than 7 Å, preferably about 5 Å or less. The ultrathin APC layer, especially if formed of iridium (Ir), provides significant coupling strength to allow thick ferromagnetic layers to be used for AP1 and AP2 without reducing $H_S$.

The AP1 and AP2 layers are preferably CoFe, with the Fe content being between approximately 5 and 80 atomic percent. The AP2 layer may be laminated to further enhance bulk spin-dependent scattering. NiFe with around 15-25 atomic percent Fe is a strong bulk scatterer and thus laminations with NiFe are useful to further enhance ΔR/R. A laminated AP2 layer may be a CoFe/NiFe or CoFe/NiFe/CoFe trilayer. Cu is also a useful lamination material because CoFe/Cu and NiFe/Cu interfaces provide high interfacial spin-dependent scattering. One or more of the free layer, the AP2 layer, the capping layer and the conductive nonmagnetic spacer layer may also include a nano-oxide layer to locally confine the current path and increase the effective resistivity. A CoFe nano-oxide layer may be formed, for example, by interrupting the deposition after some CoFe has been deposited and oxidizing its surface for several minutes in an $O_2$ or $O_2$/Ar gas at 0.1-10 Torr. Nano-oxide layers can be formed by oxidizing other materials, e.g., Cu/Al alloys.

Various CPP-SV samples were made with a 40 Å CoFe free layer, a 25 Å Cu spacer layer and the AP-pinned structure of this invention. The AP-pinned structure was made with a 5 Å Ir APC layer and various AP1 and AP2 layers. The CPP stack was defined by electron-beam lithography and had a diameter of about 100 nm. Table 1 below lists the measured CPP-SV sensor ΔR/R and the AP-pinned structure $H_S$ for these samples.

TABLE 1

| AP1 | AP2 | $H_S$ (kOe) | ΔR/R (%) |
|---|---|---|---|
| 33 Å $Co_{90}Fe_{10}$ | 35 Å $Co_{90}Fe_{10}$ | 19 | 1.6 |
| 68 Å $Co_{90}Fe_{10}$ | 70 Å $Co_{90}Fe_{10}$ | 10 | 2.3 |
| 138 Å $Co_{90}Fe_{10}$ | 140 Å $Co_{90}Fe_{10}$ | 5 | 2.8 |
| 43 Å $Co_{90}Fe_{10}$ | 10 Å $Co_{90}Fe_{10}$/50 Å $Ni_{81}Fe_{19}$/ 10 Å $Co_{90}Fe_{10}$ (moment is same as 43 Å CoFe) | 14 | 2.6 |

The data in Table 1 shows that for all AP2 layers greater than 30 Å the coupling provided by the 5 Å Ir APC layer provides an $H_S$ greater than 5 kOe and the sensor ΔR/R is greater than about 1.6%. By comparison, for a similar CPP-SV sensor with the same free and Cu spacer layer structure, but with an AP-pinned structure having thinner AP1 of 15 Å $Co_{90}Fe_{10}$, thinner AP2 of 17 Å $Co_{90}Fe_{10}$ and thicker APC of 8 Å Ru, $H_S$ was 6 kOe and ΔR/R was 1.2%.

It is preferred that the AP1 and AP2 layers have about same magnetic moment, and thus should have the about same thickness. However, for very thick AP1 and AP2 layers, AP1 should be thicker than AP2 to cancel out magnetic stray fields on the free layer. Here however, it is desired to demonstrate the effect of increasing the thickness of AP2 without concern for canceling out the magnetic stray fields, so the moments of AP1 and AP2 in the samples of Table 1 are matched. In the samples of Table 1, the AP1 layer is 2 Å thinner than the AP2 layer to account for the "dead" layer at the interface between the AP2 layer and the Cu spacer layer. In the last sample in Table 1 a trilayer of CoFe/NiFe/CoFe is used for the AP2 layer with a total physical thickness of 70 Å. However, since the magnetization of NiFe is lower than CoFe the magnetic moment of that trilayer is comparable to about 45 Å of CoFe. Thus for the last sample a 45 Å thick CoFe layer was chosen for AP1. Because NiFe is a strong bulk scatterer of spin-dependent electrons, the ΔR/R is enhanced in comparison to the samples with 35 Å and 70 Å of CoFe in AP2. Similar results to those of Table 1 were also found when ultrathin (less than 7 Å) APC layers of Ru were used.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A current-perpendicular-to-the-plane magnetoresistive read head for reading magnetically recorded data from tracks on a magnetic recording medium when a sense current is applied to the head, the head comprising:

a first electrical lead consisting of a shield layer of electrically-conductive magnetically-permeable material;

a seed layer on the first shield;

a self-pinned antiparallel (AP) pinned structure comprising a first AP-pinned (AP1) ferromagnetic layer on the seed layer and having an in-plane magnetization direction, a second AP-pinned (AP2) ferromagnetic multilayer having an in-plane magnetization direction substantially antiparallel to the magnetization direction of the AP1 layer, and an AP coupling (APC) layer between and in contact with the AP1 layer and the AP2 multilayer, each of the AP1 layer and the AP2 multilayer having a thickness greater than 50 Å, the AP2 multilayer comprising a CoFe alloy layer and a NiFe alloy layer between the APC layer and the CoFe alloy layer, and the APC layer consisting essentially of Ir and having a thickness less than or equal to 5 Å, the AP-pinned structure having a saturation magnetization greater than 5 kOe;

a nano-oxide layer comprising an oxidized surface layer of the CoFe layer;

an electrically conductive nonmagnetic spacer layer on the oxidized surface layer of the CoFe layer;

a free ferromagnetic layer on the spacer layer and having an in-plane magnetization direction oriented substantially orthogonal to the magnetization directions of the AP1 layer and the AP2 multilayer in the absence of an external magnetic field;

a capping layer on the free ferromagnetic layer; and a second electrical lead consisting of a shield layer of electrically-conductive magnetically-permeable material on the capping layer, the self-pinned AP-pinned structure, spacer layer and free ferromagnetic layer being located between said first and second leads, said sense current being directed into one of said leads, perpendicularly through the layers of the sel-pinned AP-pinned structure, spacer layer and free ferromagnetic layer and out said other lead.

2. The read head of claim 1 wherein the AP1 layer and the AP2 multilayer have substantially the same magnetic moment.

* * * * *